(12) United States Patent
Jang

(10) Patent No.: US 10,939,591 B2
(45) Date of Patent: *Mar. 2, 2021

(54) POWER CONVERSION DEVICE HAVING A CLIP FOR FIXING A PLURALITY OF SWITCHES

(71) Applicant: LG INNOTEK CO., LTD., Seoul (KR)

(72) Inventor: Shin Young Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/570,118

(22) Filed: Sep. 13, 2019

(65) Prior Publication Data

US 2020/0008315 A1 Jan. 2, 2020

Related U.S. Application Data

(63) Continuation of application No. 16/067,029, filed as application No. PCT/KR2017/000177 on Jan. 6, 2017, now Pat. No. 10,455,745.

(30) Foreign Application Priority Data

Jan. 8, 2016 (KR) .................. 10-2016-0002683

(51) Int. Cl.
*H05K 7/20* (2006.01)
*H01L 23/40* (2006.01)
(Continued)

(52) U.S. Cl.
CPC ......... *H05K 7/209* (2013.01); *H01L 23/4006* (2013.01); *H01L 23/4093* (2013.01);
(Continued)

(58) Field of Classification Search
CPC .... H05K 7/2049; H05K 7/2089–20936; H01L 23/40–4093
See application file for complete search history.

(56) References Cited

U.S. PATENT DOCUMENTS 2,200,917 A * 5/1940 Dodge .................. H01H 85/32
337/206
5,321,582 A * 6/1994 Casperson .......... H05K 7/2049
257/709
(Continued)

FOREIGN PATENT DOCUMENTS

JP 2010-251637 11/2010
JP 2011-187563 9/2011
(Continued)

OTHER PUBLICATIONS

International Search Report (with English Translation) and Written Opinion dated Feb. 28, 2017 issued in Application No. PCT/KR2017/000177.
(Continued)

*Primary Examiner* — Zachary Pape
(74) *Attorney, Agent, or Firm* — KED & Associates LLP

(57) ABSTRACT

Disclosed is a power conversion device comprising: a case; a switching unit comprising a plurality of switches which are disposed on one side of the case; a transformer disposed on one side of the case; and a clip for fixing the plurality of switches. The clip comprises: a body part which is fixed to the case; and elastic parts which extend from the body part and are for pressing the plurality of switches to the case. The body part comprises a plurality of first through holes into which screws are coupled. And the first through holes are disposed between two adjacent elastic parts.

13 Claims, 5 Drawing Sheets

(51) Int. Cl.
    *H02M 7/00* (2006.01)
    *H01L 23/473* (2006.01)
    *H05K 7/14* (2006.01)
(52) U.S. Cl.
    CPC .......... *H01L 23/473* (2013.01); *H02M 7/003* (2013.01); *H05K 7/1432* (2013.01); *H05K 7/2049* (2013.01); *H05K 7/20927* (2013.01)

(56) References Cited

U.S. PATENT DOCUMENTS

| | | | | |
|---|---|---|---|---|
| 5,344,113 | A * | 9/1994 | Jurek | H05K 7/2049 248/316.7 |
| 5,450,284 | A * | 9/1995 | Wekell | H01L 23/4006 257/719 |
| 6,266,244 | B1 * | 7/2001 | Guthrie | H01L 23/40 165/80.3 |
| 7,715,196 | B2 * | 5/2010 | Chen | H05K 7/2049 361/719 |
| 2005/0264998 | A1 * | 12/2005 | McCutcheon | H01L 23/4006 361/702 |
| 2013/0294040 | A1 | 11/2013 | Fukumasu | |
| 2014/0313806 | A1 | 10/2014 | Shinohara | |
| 2015/0305188 | A1 | 10/2015 | Maeda | |
| 2016/0047493 | A1 * | 2/2016 | Dickinson | F16B 1/00 248/73 |
| 2016/0057891 | A1 * | 2/2016 | Chang | B23P 15/26 165/80.2 |
| 2016/0270268 | A1 | 9/2016 | Suzuki | |

FOREIGN PATENT DOCUMENTS

| | | |
|---|---|---|
| JP | 2013-094022 | 5/2013 |
| JP | 2015-201543 | 11/2015 |
| KR | 10-2014-0034989 | 3/2014 |

OTHER PUBLICATIONS

U.S. Office Action dated Feb. 26, 2019 issued in parent U.S. Appl. No. 16/067,029.

* cited by examiner

POWER CONVERSION DEVICE HAVING A CLIP FOR FIXING A PLURALITY OF SWITCHES

CROSS-REFERENCE TO RELATED APPLICATIONS

This application is a Continuation Application of U.S. patent application Ser. No. 16/067,029 filed Jun. 28, 2018, which is a U.S. National Stage Application under 35 U.S.C. § 371 of PCT Application No. PCT/KR2017/000177, filed Jan. 6, 2017, which claims priority to Korean Patent Application No. 10-2016-0002683, filed Jan. 8, 2016, whose entire disclosures are hereby incorporated by reference.

TECHNICAL FIELD

The present invention relates to a power conversion device.

BACKGROUND ART

Hybrid vehicles that use a motor include a motor control unit for controlling the motor and a direct current (DC)-DC converter.

The DC-DC converter that is a device for converting power, can convert a DC into an alternating current (AC), can transform and then rectify the current, and can output a DC. In this procedure, a large amount of heat is generated in the DC-DC converter. Thus, a cooling system is provided to eliminate heat from the DC-DC converter. The cooling system can be disposed at a lower portion of a case and can absorb heat generated in components of the cooling system.

In this case, when a contact between electronic components and the case is non-uniform, cooling efficiency may be lowered. In particular, when areas in which a plurality of switches for switching voltages, for example, metal oxide semiconductor field effect transistors (MOSFETs) contact the case, are different from one another, cooling efficiency of each of the plurality of switches is changed so that performance of the DC-DC converter may be deteriorated.

DISCLOSURE

Technical Problem

The present invention is directed to providing a power conversion device in which a plurality of switches can be fixed to a case using an uniform pressure.

Technical Solution

One aspect of the present invention provides a power conversion device including: a case; a switching unit including a plurality of switches which are disposed on one surface of the case; a transformer disposed on one surface of the case; and a clip for fixing the plurality of switches, wherein the clip includes: a body part which is fixed to the case; and elastic parts which extend from the body part and are for pressing the plurality of switches to the case, wherein the body part includes a plurality of first through holes into which screws are coupled, wherein the first through holes are disposed between two adjacent elastic parts.

The body part may extend in a first direction, and the elastic parts may extend in a second direction perpendicular to the first direction.

The clip may further include a support part, which extends from the body part and is bent to face a sidewall of the case.

The number of the first through holes may be a half of the number of the plurality of switches.

The case may include a stepped portion on which the body part is disposed and which is screw-coupled.

The body part may include a first coupling groove and a second coupling groove, which are formed on both ends of the body part in the first direction.

The case may include a first protrusion inserted into the first coupling groove and a second protrusion inserted into the second coupling groove.

The power conversion device may further include: a cooling channel disposed on the other surface of the case; and a coolant inlet and a coolant outlet, which are connected to the cooling channel.

The cooling channel may include a guide protrusion disposed inside the cooling channel.

The guide protrusion may extend from the coolant inlet to the coolant outlet.

Advantageous Effects

According to embodiments, a plurality of switches can be fixed to a case using an uniform pressure. Thus, areas in which the plurality of switches contact a cooling system are uniform, which is advantageous for heat dissipation.

Various and useful advantages and effects of the present invention are not limited to the above description and could be more easily understood when specific embodiments of the present invention are described.

MODES OF THE INVENTION

Figure 1:
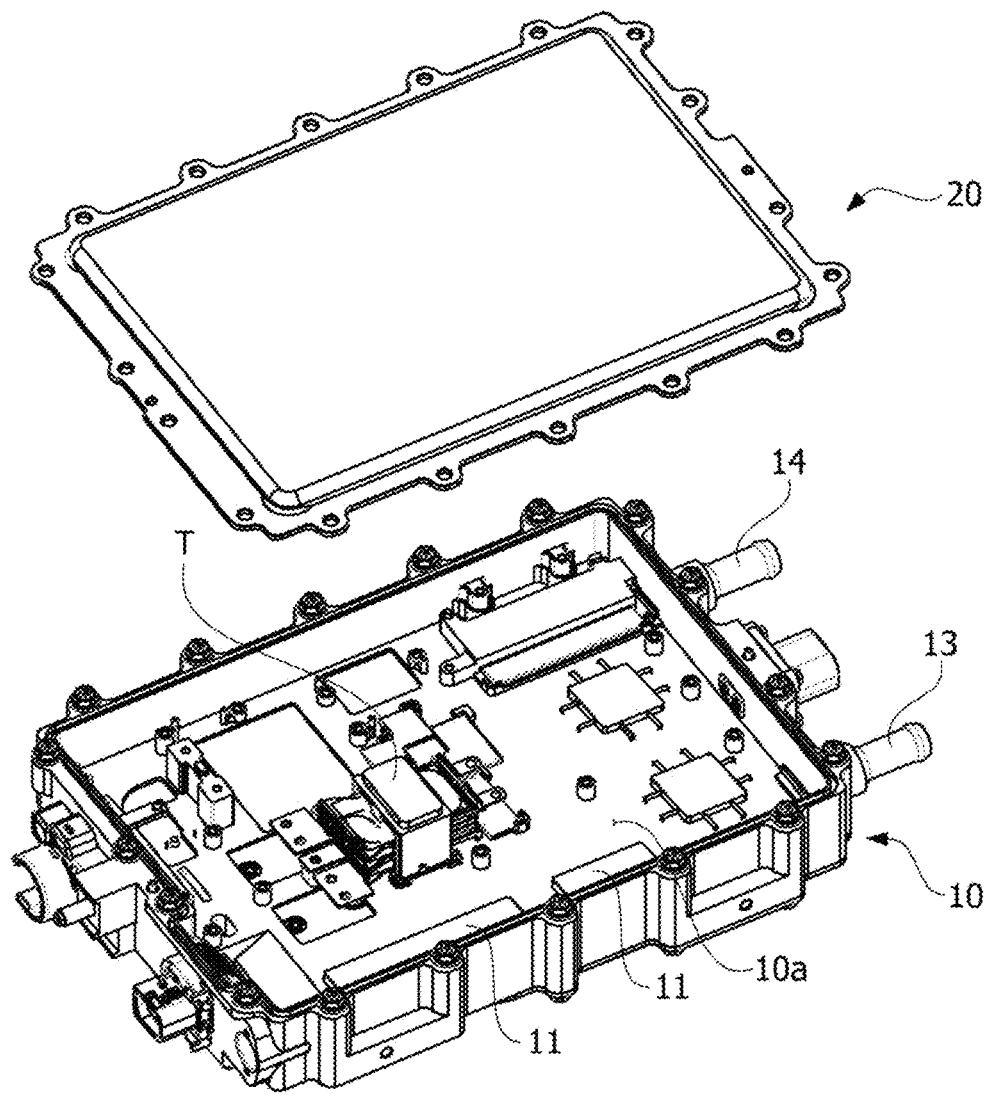
FIG. 1 is a view of a power conversion device according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used here, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components, and/or groups thereof but do not preclude the presence or addition of one or more other features, integers, steps, operations, elements, components, and/or groups thereof.

In the description of embodiments, it will be understood that when an element is referred to as being formed "on or under" another element, "on or under" means that two elements directly contact each other or one or more other elements are disposed between the two elements and are indirectly formed. In addition, the case of an expression "on or under" may refer to both an upward direction and a downward direction based on one element.

Example embodiments of the invention will be described below in more detail with reference to the accompanying drawings. Those components that are the same or are corresponding are rendered the same reference numerals regardless of the figure number, and redundant explanations are omitted.

Figure 2:
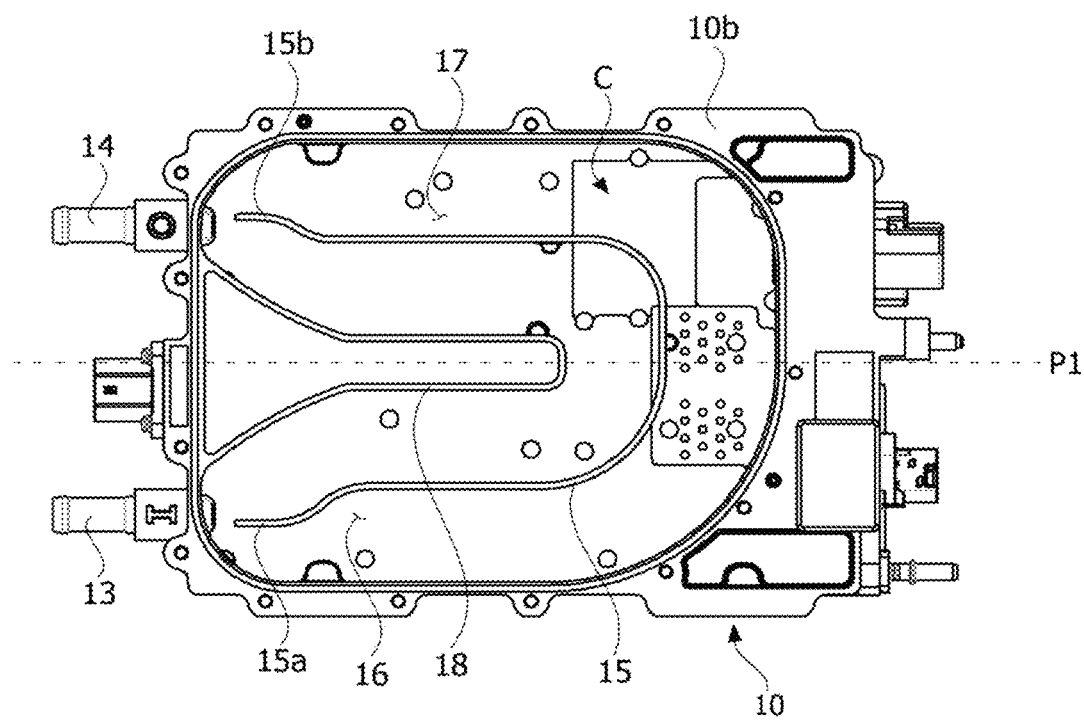
FIG. 2 is a view of a cooling channel formed on a rear surface of a case of FIG. 1.

FIG. 1 is a view of a power conversion device according to an embodiment of the present invention, and FIG. 2 is a view of a cooling channel of FIG. 1.

Referring to FIGS. 1 and 2, the power conversion device according to an embodiment may include a case 10, a plurality of electronic components 11 disposed on the case 10, a cover 20 coupled to one surface (i.e., a front or first side) of the case 10, and a cooling channel C for cooling the case 10.

A direct current (DC)-DC converter that is a device for transforming a DC voltage may convert a DC into an alternating current (AC), may transform and then rectify the current, thereby obtaining a DC. The DC-DC converter may include a switching unit 11 including a plurality of metal oxide semiconductor field effect transistors (MOSFETs), a transformer T, an inductor, and a rectifying diode. The switching unit 11 may be connected to a power terminal so as to switch a voltage, and the transformer T may transform the voltage switched by the switching unit 11.

Heat is generated in the DC-DC converter during an operation of the DC-DC converter. Thus, a cooling system is generally used to eliminate heat from the DC-DC converter. However, when an eddy occurs while a high-pressure coolant is circulated, or when the flow of a coolant is not uniform, cooling efficiency is lowered.

Referring to FIG. 2, the cooling channel C may be disposed on one surface (i.e., a bottom or second side) of the case 10. The cooling channel C may include a first channel region 16 in which the coolant is introduced and is circulated, and a second channel region 17 in which the coolant is circulated and then is discharged.

A coolant inlet 13 may be connected to the first channel region 16, and a coolant outlet 14 may be connected to the second channel region 17. The coolant inlet 13 and the coolant outlet 14 may be disposed in parallel on one side of the case 10. That is, the cooling channel C may have an U-shape.

The first channel region 16 and the second channel region 17 may be divided by a divergence part 18 that extends from one side on which the coolant inlet 13 is disposed, to the other side. That is, the first channel region 16 and the second channel region 17 may be symmetrical with each other based on a virtual line P1 formed by extending the divergence part 18. The divergence part 18 may have a width that decreases as it gets closer to the other side from one side thereof.

The first channel region 16 and the second channel region 17 may include a guide protrusion 15 that diverges the flow of the coolant. Both ends 15a and 15b of the guide protrusion 15 may be bent as they get farther away from each other. The flow of the introduced coolant is improved by both of the bent ends 15a and 15b so that an eddy can be prevented from being formed.

Figure 3:
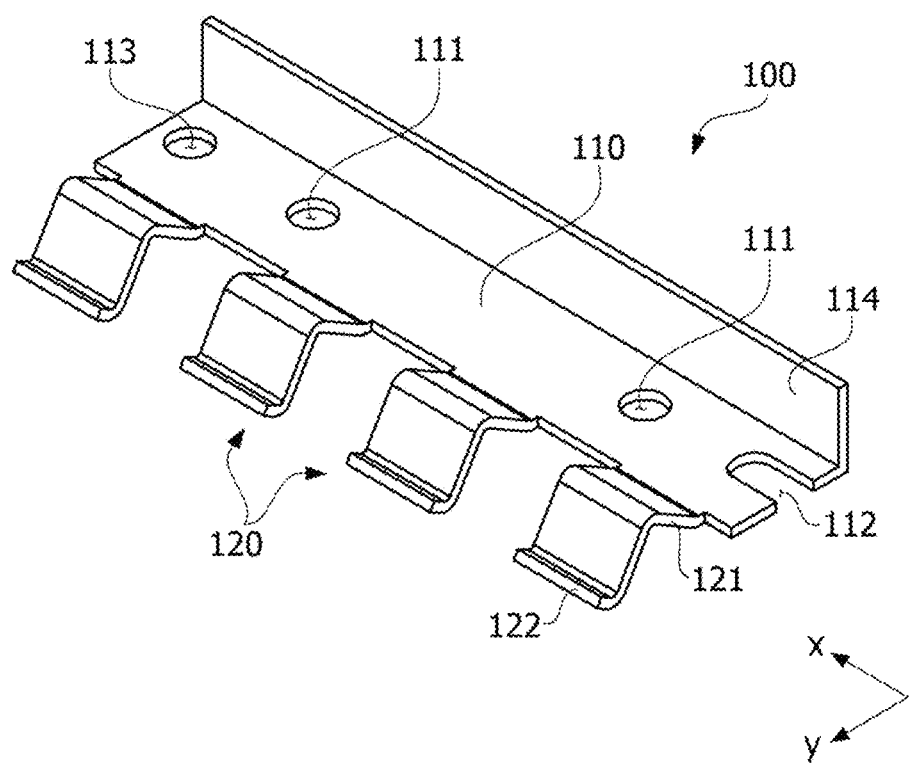
FIG. 3 is a view of a clip for fixing a switching unit of FIG. 1.
Figure 4:
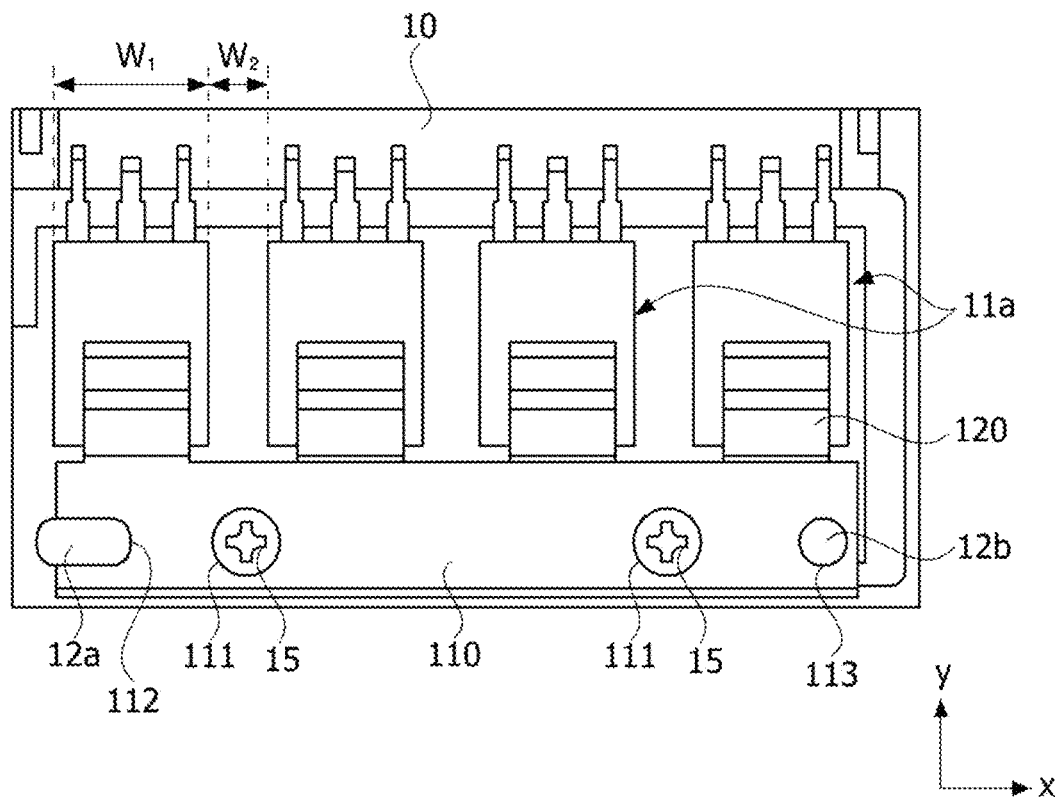
FIG. 4 is a view of a state in which the switching unit is fixed by the clip.
Figure 5:
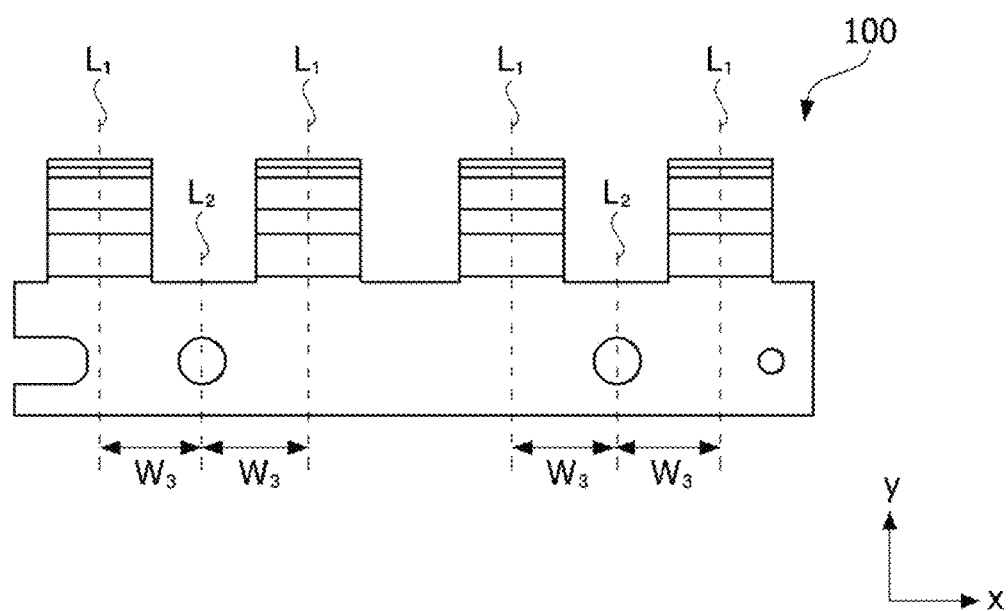
FIG. 5 is a view for explaining positions of through holes of the clip.
Figure 6:
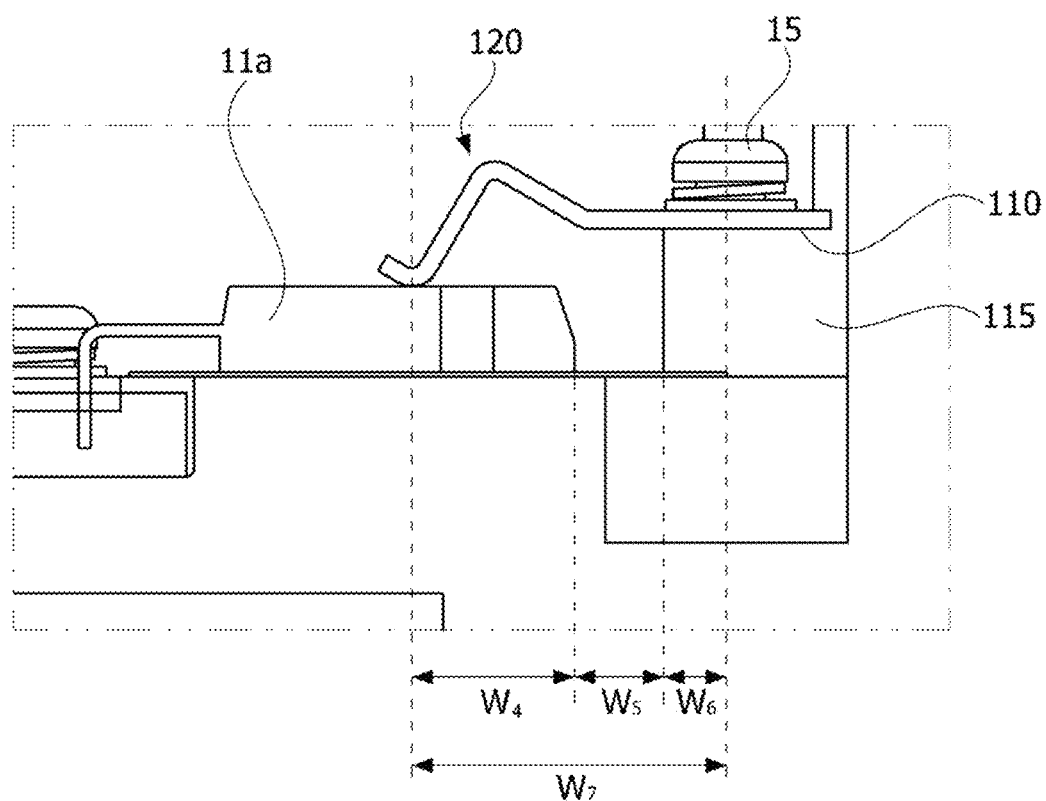
FIG. 6 is a view for explaining positions at which elastic parts of the clip press switches.

FIG. 3 is a view of a clip for fixing a switching unit of FIG. 1, FIG. 4 is a view of a state in which the switching unit is fixed by the clip, FIG. 5 is a view for explaining positions of through holes of the clip, and FIG. 6 is a view for explaining positions at which elastic parts of the clip press switches.

Referring to FIGS. 3 and 4, a clip 100 according to an embodiment includes a body part 110 fixed to the case 10, and elastic parts 120 for pressing a plurality of switches 11a to the case 10.

The body part 110 includes a plurality of first through holes 111 and first and second coupling grooves 112 and 113. Screws 15 are coupled into the first through holes 111, and the first through holes 111 are fixed to the case 10. The first and second coupling grooves 112 and 113 may be formed in one end and the other end of the body part 110 in a first direction. The body part 110 may extend in the first direction, and a width of the body part 110 in a second direction may be about 14 mm or more. The first direction is an X-direction of the drawings, and the second direction is a Y-direction of the drawings.

The plurality of elastic parts 120 extend from the body part 110 in the second direction. The elastic parts 120 may be bent to press the switches 11a (i.e., on the front or first side of the case 10) when the body part 110 is fixed to the case 10. Each of the elastic parts 120 may include a bending part 121 and a contact part 122. The shape of the elastic parts 120 is not specially limited.

A support part 114 may protrude in an opposite direction to the second direction and may be vertically bent. The support part 114 may be disposed on a sidewall of the case 10, where the sidewall is between the first side and the second side of the case 10. When screw coupling is performed by the support part 114, rotation of the clip 100 can be prevented.

Referring to FIG. 4, the body part 110 may extend to cover the plurality of switches 11a. Thus, each of the elastic parts 120 may extend from the body part 110 in the second direction and may press upper portions of the switches 11a, respectively.

The first and second coupling grooves 112 and 113 formed in both ends of the body part 110 are inserted into first and second protrusions 12a and 12b, respectively, which protrude from the case 10. The first and second protrusions 12a and 12b may be disposed on a stepped portion of the case. Thus, when the screws 15 are inserted into the first through holes 111, rotation of the body part 110 can be prevented. The first coupling groove 112 may be a slit formed in a side surface of the body part 110.

When the body part 110 is disposed on the stepped portion of the case 10, firstly, the first and second protrusions 12a and 12b are inserted into the first and second coupling grooves 112 and 113, respectively, so that the body part 110 can be disposed at its correct position. Subsequently, the screws 15 may be coupled into the first through holes 111 and fixed thereto.

The number of first through holes 111 may be a half of the number of a plurality of switches 11a. For example, when there are four switches 11a, the number of first through holes 111 may be two, and when there are six switches 11a, the number of first through holes 111 may be three. However, the number of first through holes and the number of switches are not necessarily limited thereto.

A position of the first through holes 111 may be determined by a width $W_1$ of each of the switches 11a and a distance $W_2$ between the switches 11a. That is, the position of the first through holes 111 may be a position at which there is a half $((2W_1+W_2)/2)$ of a value obtained by adding the width $W_1$ of two switches 11a and the distance $W_2$ between the switches 11a.

Referring to FIG. 5, a distance $W_3$ between a central line $L_2$ of the first through holes 111 and an adjacent virtual straight line $L_1$ may be uniform. The virtual straight line $L_1$ is a virtual straight line in which the elastic parts 120 are divided by two in a longitudinal direction.

Through this configuration, when the screws are coupled into the first through holes 111, pressures generated by press of the adjacent elastic parts 120 may be almost the same. Thus, a bending phenomenon may be alleviated compared to a structure for screw-coupling both ends of the body part (see FIG. 7).

Referring to FIG. 6, a point where the elastic parts 120 press the switches 11a, may be a center of the switches 11a. A press optimum distance $W_7$ may be the sum of a distance $W_4$ from an end to the center of the switches 11a and a distance $(W_5+W_6)$ from the end of the switches 11a to a center of the first through holes 111. Through this configuration, the center of the switches 11a may be pressed so that overall uniform areas of the switches 11a can be in contact with the case 10. The press optimum distance $W_7$ may be 15 mm to 25 mm, and a distance $W_5$ from the end of the switches 11a to a stepped portion 115 into which the screws are coupled, may be about 5.5 mm.

Figure 7:
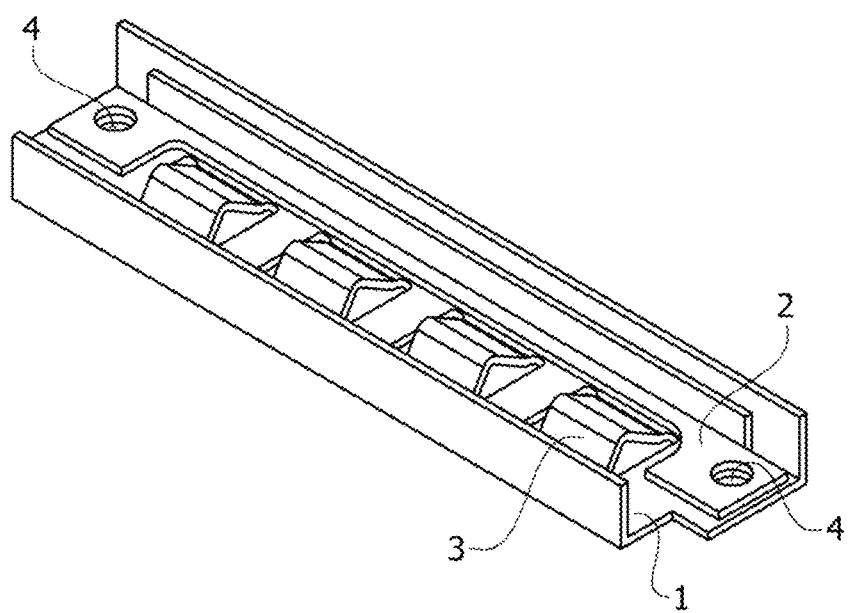
FIG. 7 is a view for explaining a conventional clip.
Figure 8:
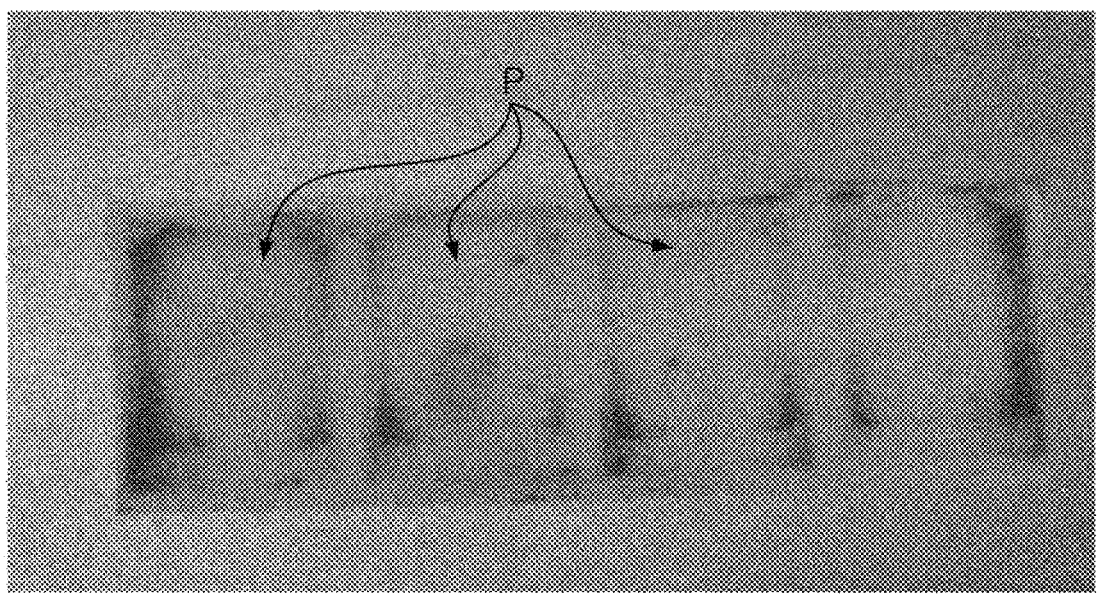
FIG. 8 is a photo showing pressure distribution of switches fixed by the conventional clip.

FIG. 7 is a view for explaining a conventional clip, and FIG. 8 is a photo showing pressure distribution of switches fixed by the conventional clip.

Referring to FIGS. 7 and 8, when screws are coupled into holes 4 formed in both ends of the clip and the clip is fixed to a case, bending occurs. Thus, two plates 1 and 2 are required to be manufactured by overlapping each other.

In addition, a press force of elastic parts 3 closer to the holes is relatively increased so that contact areas P of a plurality of switches may be different from each other. Thus, a difference in cooling among the plurality of switches occurs so that performance of the power conversion device may be deteriorated.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A power conversion device comprising:
   a case comprising a first protrusion and a second protrusion;
   a switching unit comprising a plurality of switches disposed on one surface of the case; and
   a clip for fixing the plurality of switches; and
   wherein the clip comprises:
     a body part which extends in a first direction; and
     elastic parts which extend from one side of the body part and are for pressing the plurality of switches to the case,
   wherein the body part comprises:
     a plurality of first through holes, which are disposed in the first direction and into which screws are coupled;
     a first coupling groove disposed on one end of the body part in the first direction; and
     a second coupling groove disposed on the other end of the body part in the first direction,
     wherein the first protrusion is coupled to the first coupling groove and the second protrusion is coupled to the second coupling groove,
     wherein the first coupling groove is longer than the second coupling groove in the first direction,
     wherein the first through holes are disposed between the first coupling groove and the second coupling groove, and
     wherein a total number of the plurality of first through holes is a half of a total number of the plurality of switches.

2. The power conversion device of claim 1, wherein the case comprises a stepped portion on which the body part is disposed, and a straight-line distance from an end of the switches facing the stepped portion to the stepped portion is shorter than a straight-line distance from the end of the switches to a point where the elastic parts press the switches.

3. The power conversion device of claim 1, wherein the clip further comprises a support part, which extends from the body part and is bent to face a sidewall of the case.

4. The power conversion device of claim 1, further comprising
   a transformer disposed on one surface of the case,
   a cooling channel disposed on the other surface of the case, and
   a coolant inlet and a coolant outlet, which are connected to the cooling channel, wherein the cooling channel comprises a first channel region connected to the coolant inlet and a second channel region connected to the coolant outlet.

5. The power conversion device of claim 4, wherein the cooling channel comprises a divergence part disposed between the first channel region and the second channel region, and the divergence part has a width that decreases as it gets farther away from the coolant inlet and the coolant outlet.

6. The power conversion device of claim 4, wherein the cooling channel comprises a guide protrusion disposed inside the cooling channel.

7. The power conversion device of claim 6, wherein the guide protrusion extends from the coolant inlet to the coolant outlet.

8. The power conversion device of claim 6, wherein the guide protrusion comprises a first end part facing the coolant inlet and a second end part facing the coolant outlet, and the first end part and the second end part are bent as they get farther away from each other.

9. A power conversion device comprising:
a case comprising a first protrusion and a second protrusion;
a switching unit comprising a plurality of switches disposed on one surface of the case;
a clip for fixing the plurality of switches;
a transformer disposed on one surface of the case;
a cooling channel disposed on the other surface of the case; and
a coolant inlet and a coolant outlet, which are connected to the cooling channel,
wherein the clip comprises:
   a body part which extends in a first direction; and
   elastic parts which extend from one side of the body part and are for pressing the plurality of switches to the case,
wherein the body part comprises:
   a plurality of first through holes, which are disposed in the first direction and into which screws are coupled;
   a first coupling groove disposed on one end of the body part in the first direction; and
   a second coupling groove disposed on the other end of the body part in the first direction,
   wherein the first protrusion is coupled to the first coupling groove and the second protrusion is coupled to the second coupling groove,
   wherein the first coupling groove is longer than the second coupling groove in the first direction,
   wherein the first through holes are disposed between the first coupling groove and the second coupling groove,
   wherein the cooling channel comprises a first channel region connected to the coolant inlet and a second channel region connected to the coolant outlet.

10. The power conversion device of claim 9, wherein the cooling channel comprises a divergence part disposed between the first channel region and the second channel region, and the divergence part has a width that decreases as it gets farther away from the coolant inlet and the coolant outlet.

11. The power conversion device of claim 9, wherein the cooling channel comprises a guide protrusion disposed inside the cooling channel.

12. The power conversion device of claim 11, wherein the guide protrusion extends from the coolant inlet to the coolant outlet.

13. The power conversion device of claim 11, wherein the guide protrusion comprises a first end part facing the coolant inlet and a second end part facing the coolant outlet, and the first end part and the second end part are bent as they get farther away from each other.

* * * * *